US010355127B2

(12) United States Patent
Suekawa

(10) Patent No.: US 10,355,127 B2
(45) Date of Patent: Jul. 16, 2019

(54) SEMICONDUCTOR DEVICE

(71) Applicant: Mitsubishi Electric Corporation,
Tokyo (JP)

(72) Inventor: Eisuke Suekawa, Tokyo (JP)

(73) Assignee: Mitsubishi Electric Corporation,
Tokyo (JP)

( * ) Notice: Subject to any disclaimer, the term of this patent is extended or adjusted under 35 U.S.C. 154(b) by 75 days.

(21) Appl. No.: 15/571,795

(22) PCT Filed: Jul. 2, 2015

(86) PCT No.: PCT/JP2015/069096
§ 371 (c)(1),
(2) Date: Nov. 3, 2017

(87) PCT Pub. No.: WO2017/002255
PCT Pub. Date: Jan. 5, 2017

(65) Prior Publication Data
US 2019/0123195 A1    Apr. 25, 2019

(51) Int. Cl.
*H01L 27/02* (2006.01)
*H01L 29/08* (2006.01)
(Continued)

(52) U.S. Cl.
CPC ...... *H01L 29/7815* (2013.01); *H01L 27/0251* (2013.01); *H01L 27/088* (2013.01); *H01L 29/0878* (2013.01); *H01L 29/1608* (2013.01)

(58) Field of Classification Search
CPC .............. H01L 27/0251; H01L 27/088; H01L 29/1608; H01L 29/7815
See application file for complete search history.

(56) References Cited

U.S. PATENT DOCUMENTS 5,097,302 A    3/1992 Fujihira et al.
8,278,706 B2   10/2012 Takano
(Continued)

FOREIGN PATENT DOCUMENTS

JP    H03-270274 A    12/1991
JP    2011-066121 A   3/2011
WO    2011/161721 A1  12/2011

OTHER PUBLICATIONS

International Preliminary Report on Patentability issued in PCT/JP2015/069096; dated Jan. 11, 2018.
(Continued)

*Primary Examiner* — Daniel P Shook
(74) *Attorney, Agent, or Firm* — Studebaker & Brackett PC

(57) ABSTRACT

The present technique relates to a semiconductor device including a current sensor, which can improve the electrostatic discharge ruggedness. The semiconductor device includes: a first switching element through which a main current flows; and a second switching element through which a sense current flows. The first switching element includes a first gate oxide film formed in contact with a first base layer sandwiched between a first source layer and a drift layer. The second switching element includes a second gate oxide film formed in contact with a second base layer sandwiched between a second source layer and the drift layer. A part of the second gate oxide film including a portion covering the second base layer is thicker than the first gate oxide film.

10 Claims, 11 Drawing Sheets

(51) Int. Cl.
*H01L 29/16* (2006.01)
*H01L 29/78* (2006.01)
*H01L 27/088* (2006.01)

(56) References Cited

U.S. PATENT DOCUMENTS

| | | |
|---|---|---|
| 9,293,572 B2 | 3/2016 | Furukawa et al. |
| 2011/0062514 A1* | 3/2011 | Takano ............ H01L 21/823487 257/334 |
| 2012/0132912 A1* | 5/2012 | Suekawa ................ H01L 29/45 257/49 |

OTHER PUBLICATIONS

International Search Report issued in PCT/JP2015/069096; dated Sep. 29, 2015.

* cited by examiner

F I G. 1 7
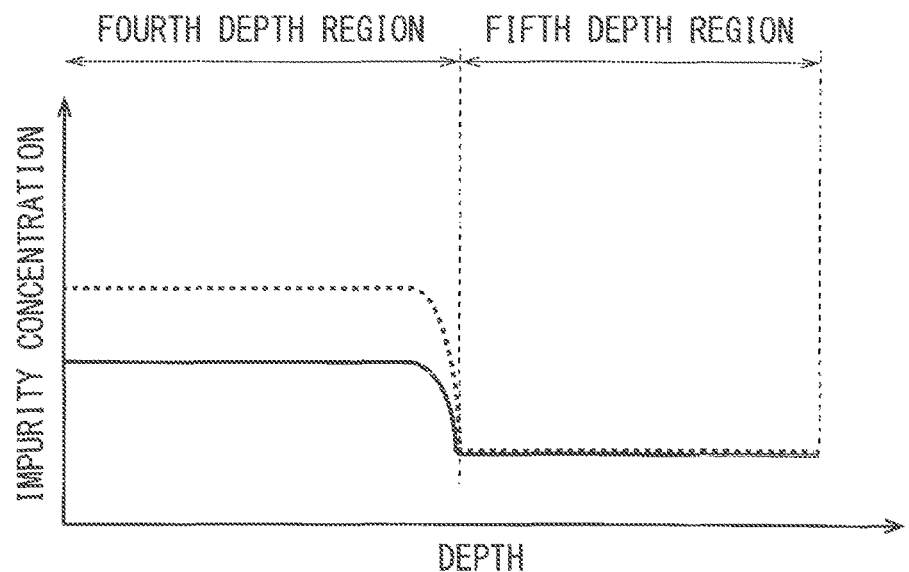
F I G. 1 8
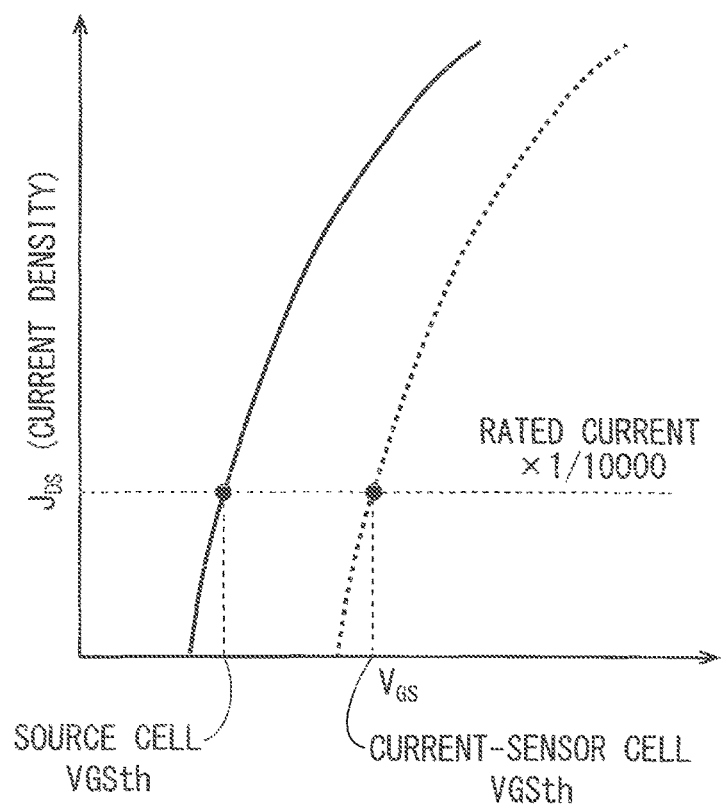

F I G. 2 1
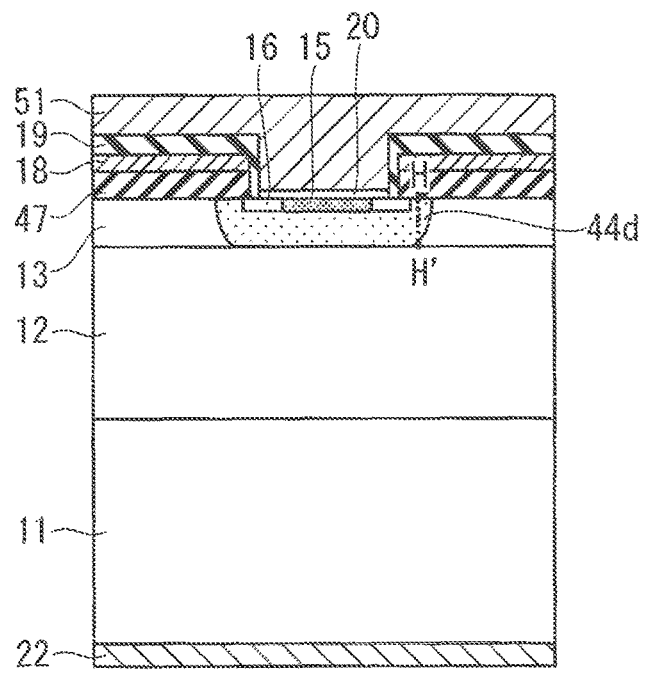
F I G. 2 2
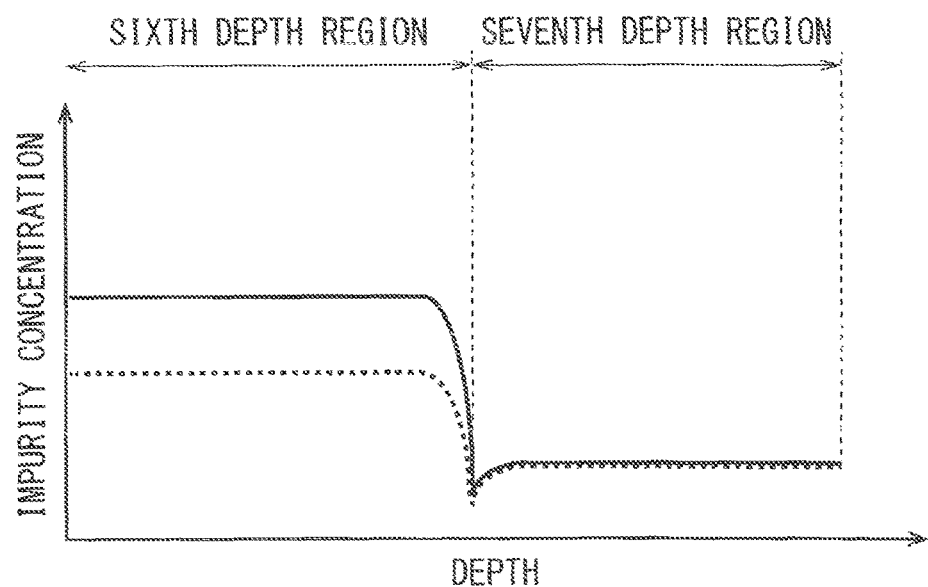

SEMICONDUCTOR DEVICE

TECHNICAL FIELD

The present technique relates to a semiconductor device and particularly to a metal-oxide-semiconductor field-effect transistor (MOSFET) used in, for example, an inverter.

BACKGROUND ART

Unit cells of a source cell portion with a MOSFET including a current sensor are disposed in a source pad. Unit cells of a current-sensor cell portion with a MOSFET including a current sensor are also disposed in a current sensor pad.

Each of the unit cells of the source cell portion includes: an $n^+$ buffer layer of n-type; an $n^-$ layer of n-type formed on the $n^+$ buffer layer, a junction field effect transistor (JFET) $n^+$ layer of n-type formed in a surface layer of the $n^-$ layer (hereinafter may be referred to as a "JFET $n^+$ layer"); a p-base layer of p-type formed in the surface layer of the $n^-$ layer; a $p^+$ layer of p-type formed in a surface layer of the p-base layer; an $n^+$ source layer of n-type formed to sandwich the $p^+$ layer in the surface layer of the p-base layer; gate polysilicon functioning as a gate electrode and formed above the p-base layer to sandwich a gate oxide film; an interlayer insulation film formed to cover the gate polysilicon; an Ni—Si layer formed across a part of the $n^+$ source layer and the $p^+$ layer; a source electrode formed to cover the interlayer insulation film and the Ni—Si layer; and a drain electrode formed on the back side of the $n^+$ buffer layer.

Each of the unit cells of the current-sensor cell portion includes: an $n^+$ buffer layer of n-type; an $n^-$ layer of n-type; a JFET $n^+$ layer of n-type; a p-base layer of p-type; a $p^+$ layer of p-type; an $n^+$ source layer of n-type; gate polysilicon; an interlayer insulation film; an Ni—Si layer; a current-sensor electrode formed to cover the interlayer insulation film and the Ni—Si layer; and a drain electrode.

As described above, the unit cells in the source cell portion and the current-sensor cell portion basically have the same structure. The number of unit cells disposed in the current-sensor cell portion approximately ranges from $1/10000$ to $1/5000$ of the number of unit cells disposed in the source cell portion.

With the structure, the MOSFET including the current sensor allows a current that amounts to approximately $1/10000$ to $1/5000$ of the current flowing through the source to flow through the current sensor.

An intelligent power module (IPM) with a protection circuit uses a MOSFET chip including a current sensor (see, for example, Patent Document 1). When an overcurrent such as a short-circuit current flows between drain and source due to, for example, a load short-circuit in an inverter circuit, detecting a current flowing through the current sensor and feeding it back to the protection circuit can prevent an overcurrent failure in the IPM.

PRIOR-ART DOCUMENTS

Patent Documents

Patent Document 1: Japanese Patent Application Laid-Open No. H3-270274

SUMMARY

Problems to be Solved by the Invention

MOSFETs using SiC wafers (may be hereinafter referred to as "SiC-MOSFETs") typically have low channel mobility. To reduce the ON resistance in the MOSFETs using SiC wafers (SiC-MOSFETs), for example, a gate oxide film is formed thinner than that included in an IGBT using a SiC wafer.

However, when the gate oxide film is formed thinner, the electrostatic discharge ruggedness between gate and source decreases. Particularly with a MOSFET including a current sensor, the current-sensor cell portion having fewer unit cells and smaller capacity has electrostatic discharge ruggedness much lower than that of the source cell portion. Thus, the electrostatic discharge sometimes occurs in, for example, an assembly process. If the electrostatic discharge occurs in the current-sensor cell portion, it is not possible to properly detect an overcurrent and perform an operation for protection against the overcurrent.

The present technique has been conceived to solve such problems, and relates to a semiconductor device including a current sensor, which can improve the electrostatic discharge ruggedness.

Means to Solve the Problems

The semiconductor device according to an aspect of the present technique is a semiconductor device including: a first switching element through which a main current flows; and a second switching element through which a sense current flows, the first switching element including: a drift layer of a first conductivity type; a first base layer of a second conductivity type, the first base layer being formed in a surface layer of the drift layer; a first source layer of the first conductivity type, the first source layer being formed in a surface layer of the first base layer; a first gate oxide film formed in contact with the first base layer sandwiched between the first source layer and the drift layer; and a first gate electrode formed in contact with the first gate oxide film, and the second switching element including: the drift layer, a second base layer of the second conductivity type, the second base layer formed in the surface layer of the drift layer to be spaced apart from the first base layer; a second source layer of the first conductivity type, the second source layer being formed in a surface layer of the second base layer; a second gate oxide film formed in contact with the second base layer sandwiched between the second source layer and the drift layer; and a second gate electrode formed in contact with the second gate oxide film, wherein a part of the second gate oxide film including a portion covering the second base layer is thicker than the first gate oxide film.

Effects of the Invention

The semiconductor device according to an aspect of the present technique is a semiconductor device including: a first switching element through which a main current flows; and a second switching element through which a sense current flows, the first switching element including: a drift layer of a first conductivity type; a first base layer of a second conductivity type, the first base layer being formed in a surface layer of the drift layer; a first source layer of the first conductivity type, the first source layer being formed in a surface layer of the first base layer; a first gate oxide film formed in contact with the first base layer sandwiched between the first source layer and the drift layer; and a first gate electrode formed in contact with the first gate oxide film, and the second switching element including: the drift layer; a second base layer of the second conductivity type, the second base layer formed in the surface layer of the drift layer to be spaced apart from the first base layer; a second source layer of the first conductivity type, the second source layer being formed in a surface layer of the second base layer, a second gate oxide film formed in contact with the second base layer sandwiched between the second source layer and the drift layer; and a second gate electrode formed in contact with the second gate oxide film, wherein a part of the second gate oxide film including a portion covering the second base layer is thicker than the first gate oxide film.

With such a structure in which a part of the second gate oxide film including a portion covering the second base layer in the second switching element through which the sense current flows is thicker than the first gate oxide film in the first switching element through which the main current flows, the electrostatic discharge ruggedness of the semiconductor device including the current sensor can be improved.

The object, features, aspects and advantages of the present technique will become more apparent from the following detailed description and the accompanying drawings.

BRIEF DESCRIPTION OF DRAWINGS

FIG. 17 is a diagram exemplifying the respective concentration profiles of the channel forming portions in the unit cells of the source cell portion and the current-sensor cell portion.

FIG. 18 is a diagram exemplifying respective transfer characteristics of the source cell portion with the SiC-MOSFET exemplified in FIG. 4 and the current-sensor cell portion with the SiC-MOSFET exemplified in FIG. 5 per current density.

FIG. 21 is a cross-sectional view schematically illustrating the structure of the unit cell in the current-sensor cell portion with the SiC-MOSFET according to the embodiment.

FIG. 22 is a diagram exemplifying the respective concentration profiles of the channel forming portions in the unit cells of the source cell portion and the current-sensor cell portion.

DESCRIPTION OF EMBODIMENTS

Figure 1:
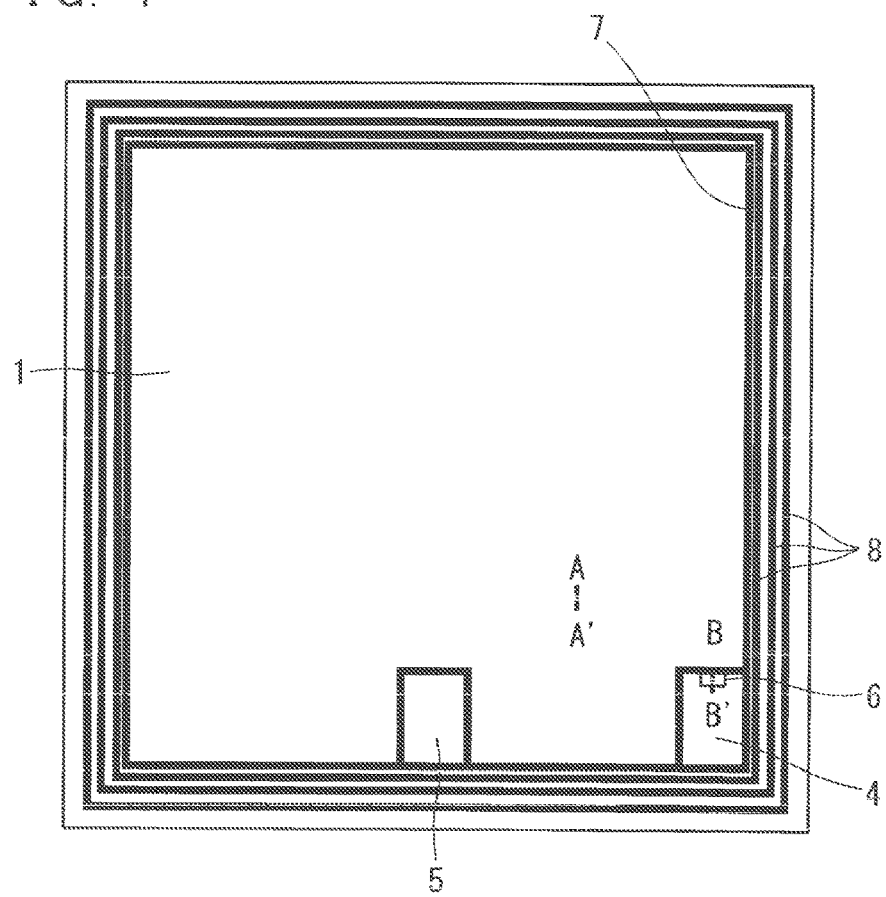
FIG. 1 is a plan view exemplifying a surface of a semiconductor chip with a MOSFET.

Embodiments will be hereinafter described with reference to the attached drawings. The drawings are schematically illustrated, and the mutual relationships in size and position between images in the different drawings are not necessarily accurate but may be appropriately changed. In the following description, the same reference numerals are assigned to the same constituent elements, and their names and functions are the same. Thus, the detailed description thereof may be omitted.

In the following description, even when terms expressing a particular position and a particular direction such as "up", "down", "side", "bottom", "front", or "back" are used, these terms are used for convenience to facilitate the understanding of the details of Embodiments, and do not relate to the directions that are actually used.

Embodiment 1

[Structure]

A MOSFET as an example semiconductor device according to Embodiment 1 will be described hereinafter. First, a SiC-MOSFET having the same structure in unit cell between a current-sensor cell portion and a source cell portion and including a current sensor for detecting an overcurrent will be described for convenience.

Figure 2:
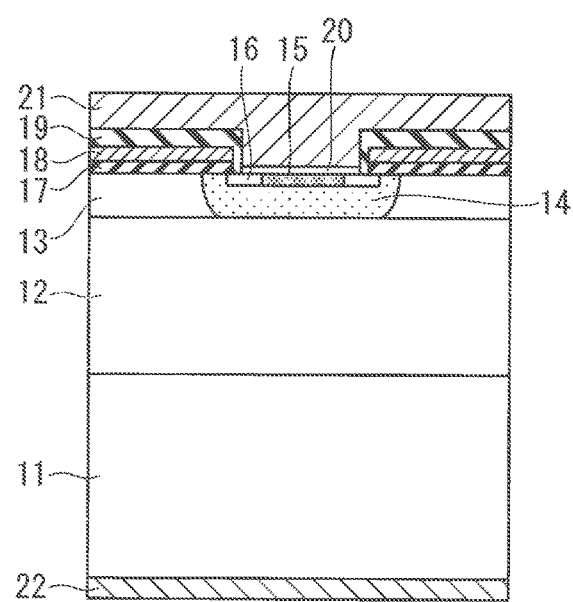
FIG. 2 is a cross-sectional view schematically illustrating a structure of a unit cell in a source cell portion.
Figure 3:
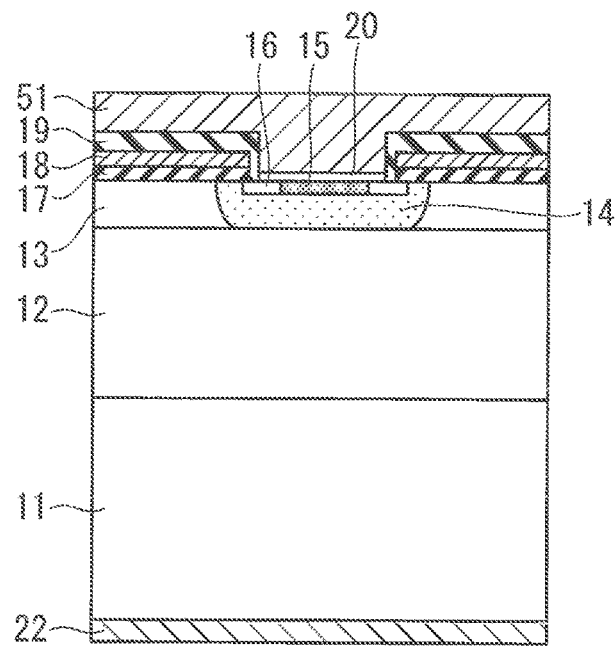
FIG. 3 is a cross-sectional view schematically illustrating a structure of a unit cell in a current-sensor cell portion.

FIG. 1 is a plan view exemplifying a surface of a semiconductor chip with a MOSFET including a current sensor. Furthermore, FIG. 2 is a cross-sectional view schematically illustrating a structure of a unit cell in the source cell portion. Furthermore, FIG. 3 is a cross-sectional view schematically illustrating a structure of a unit cell in the current-sensor cell portion. FIG. 2 corresponds to a cross-section A-A' in FIG. 1. Furthermore, FIG. 3 corresponds to a cross-section B-B' in FIG. 1.

With the MOSFET including the current sensor, a plurality of the unit cells of the source cell portion exemplified in FIG. 2 are disposed in a source pad 1 exemplified in FIG. 1. With the MOSFET including the current sensor, a plurality of the unit cells of the current-sensor cell portion exemplified in FIG. 3 are also disposed in a current sensor pad 4 exemplified in FIG. 1.

As exemplified in FIG. 1, the front side of the semiconductor chip includes a gate pad 5, the source pad 1, a gate line 7 disposed to enclose the gate pad 5 and the current sensor pad 4, and a plurality of field limiting rings (FLR) 8 disposed to further enclose the gate line 7.

The unit cell exemplified in FIG. 2 is disposed in the source cell portion. The unit cell includes: an n$^+$ buffer layer 11 of n-type; an n$^-$ layer 12 of n-type formed on the n$^+$ buffer layer 11; a JFET n$^+$ layer 13 of n-type formed in a surface layer of the n$^-$ layer 12; a p-base layer 14 of p-type formed in the surface layer of the n$^-$ layer 12; a p$^+$ layer 15 of p-type formed in a surface layer of the p-base layer 14; an n$^+$ source layer 16 of n-type formed in the surface layer of the p-base layer 14 to sandwich the p$^+$ layer 15 in FIG. 2; gate polysilicon 18 functioning as a gate electrode and formed above the p-base layer 14 to sandwich a gate oxide film 17; an interlayer insulation film 19 formed to cover the gate polysilicon 18; an Ni—Si layer 20 formed across a part of the n$^+$ source layer 16 and the p$^+$ layer 15; a source electrode 21 formed to cover the interlayer insulation film 19 and the Ni—Si layer 20; and a drain electrode 22 formed on the back side of the n$^+$ buffer layer 11.

The unit cell exemplified in FIG. 3 is disposed in the current-sensor cell portion. The unit cell includes the n$^+$ buffer layer 11 of n-type, the n$^-$ layer 12 of n-type, the JFET n$^+$ layer 13 of n-type, the p-base layer 14 of p-type, the p$^+$ layer 15 of p-type, the n$^+$ source layer 16 of n-type, the gate oxide film 17, the gate polysilicon 18, the interlayer insulation film 19, the Ni—Si layer 20, a current-sensor electrode 51 formed to cover the interlayer insulation film 19 and the Ni—Si layer 20, and the drain electrode 22.

As described above, the unit cells in the source cell portion and the current-sensor cell portion basically have the same structure. The number of unit cells disposed in the current-sensor cell portion approximately ranges from 1/10000 to 1/5000 of the number of unit cells disposed in the source cell portion.

With the structure, the MOSFET including the current sensor allows a current that amounts to approximately 1/10000 to 1/5000 of the current flowing through the source to flow through the current sensor.

An intelligent power module (IPM) with a protection circuit uses a MOSFET chip including a current sensor. When an overcurrent such as a short-circuit current flows between drain and source due to, for example, a load short-circuit in an inverter circuit, detecting a current flowing through the current sensor and feeding it back to the protection circuit can prevent an overcurrent failure in the IPM.

Figure 4:
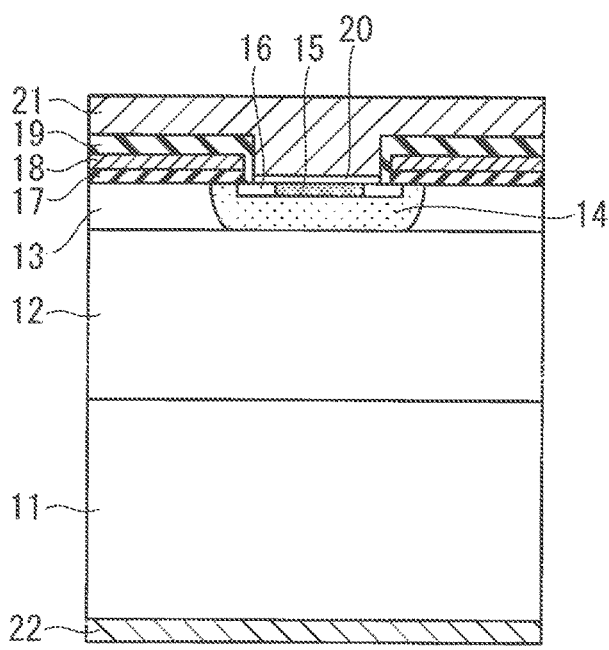
FIG. 4 is a cross-sectional view schematically illustrating a structure of a unit cell in a source cell portion with a SiC-MOSFET according to an embodiment.

FIG. 4 is a cross-sectional view schematically illustrating a structure of a unit cell in a source cell portion with a SiC-MOSFET according to Embodiment 1. In the source cell portion, the thickness of the gate oxide film 17 approximately ranges from 45 nm to 50 nm. FIG. 4 corresponds to the cross-section A-A' in FIG. 1.

Figure 5:
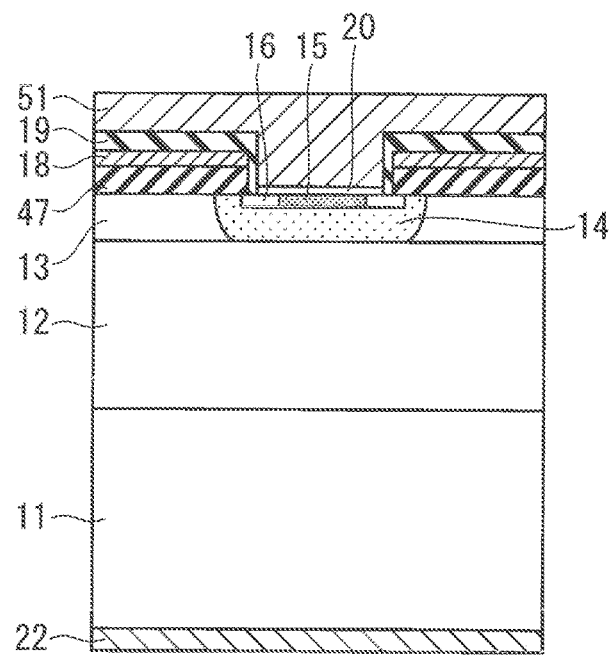
FIG. 5 is a cross-sectional view schematically illustrating a structure of a unit cell in a current-sensor cell portion with a SiC-MOSFET according to the embodiment.

FIG. 5 is a cross-sectional view schematically illustrating a structure of a unit cell in a current-sensor cell portion with the SiC-MOSFET according to Embodiment 1. In the current-sensor cell portion, the thickness of a gate oxide film 47 approximately ranges from 80 nm to 100 nm. FIG. 5 corresponds to the cross-section B-B' in FIG. 1.

When a gate oxide film in a source cell portion is as thick as a gate oxide film in a current-sensor cell portion, the electrostatic discharge ruggedness measured by the human-body model (HBM) (for example, JESD22-A114F (JEDEC)) is approximately 1000 V. Since the thickness of the gate oxide film 47 in the current-sensor cell portion approximately ranges from 80 nm to 100 nm in the structure according to Embodiment 1 as exemplified in FIG. 5, the electrostatic discharge ruggedness measured by the HBM is approximately higher than or equal to 1500 V.

Embodiment 2

A MOSFET as an example semiconductor device according to Embodiment 2 will be described. Hereinafter, the same reference numerals will be assigned to the same structures described in Embodiment 1, and the detailed description thereof will be appropriately omitted.

Figure 6:
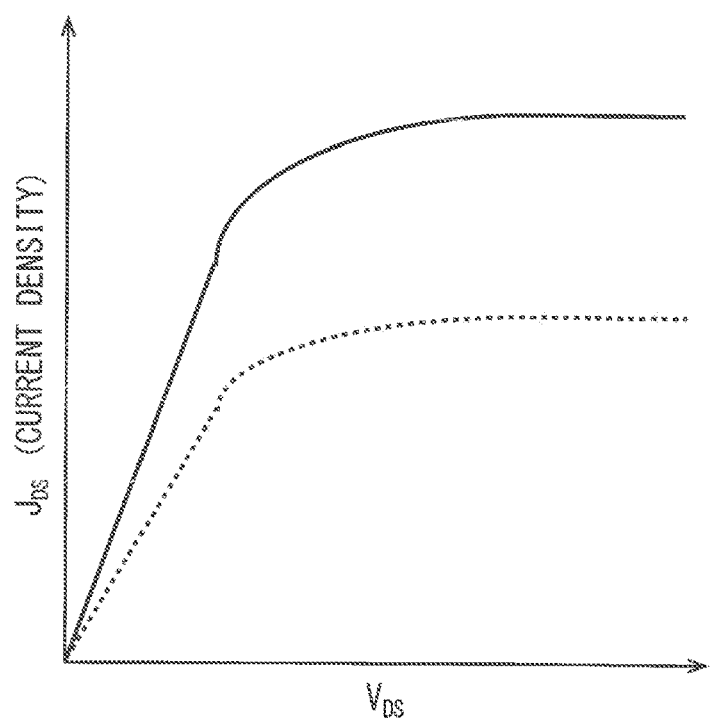
FIG. 6 is a diagram exemplifying respective output characteristics of the source cell portion with the SiC-MOSFET exemplified in FIG. 4 and the current-sensor cell portion with the SiC-MOSFET exemplified in FIG. 5 per current density.

FIG. 6 is a diagram exemplifying output characteristics of the source cell portion with the SiC-MOSFET exemplified in FIG. 4 per current density (a solid line) and output characteristics of the current-sensor cell portion with the SiC-MOSFET exemplified in FIG. 5 per current density (a dotted line). In FIG. 6, the vertical axis represents the current density ($J_{DS}$), and the horizontal axis represents the voltage ($V_{DS}$).

Figure 7:
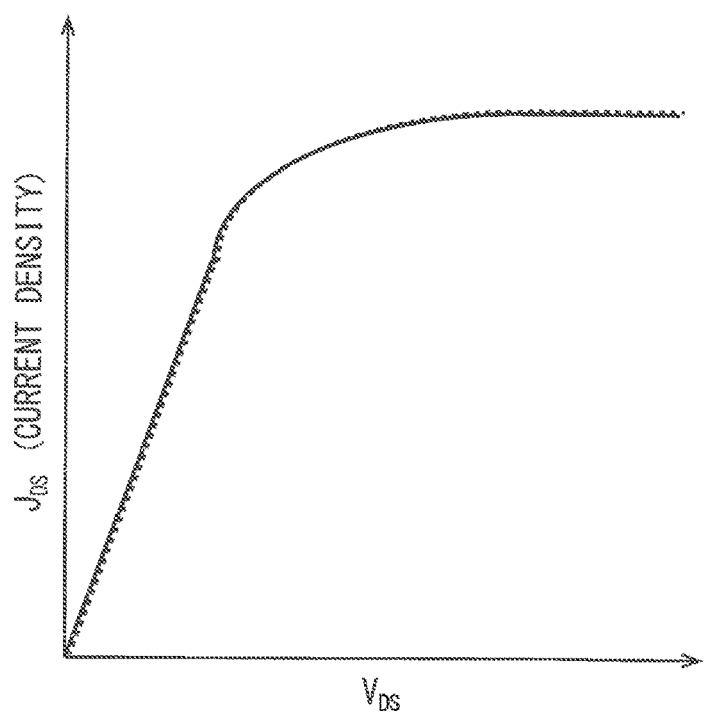
FIG. 7 is a diagram exemplifying output characteristic waveforms of the SiC-MOSFETs exemplified in FIGS. 4 and 5 when the output characteristics of the source cell portion and the current-sensor cell portion per current density are combined.

FIG. 7 is a diagram exemplifying output characteristic waveforms of the SiC-MOSFETs exemplified in FIGS. 4 and 5 when the output characteristics of the source cell portion and the current-sensor cell portion per current density are combined. In FIG. 7, the vertical axis represents the current density ($J_{DS}$), and the horizontal axis represents the voltage ($V_{DS}$).

Since the gate oxide film 47 in the current-sensor cell portion is formed thicker than the gate oxide film 17 in the source cell portion in the structure, the channel resistance in the current-sensor cell portion becomes higher.

Thus, the ON resistance in the current-sensor cell portion becomes higher than that in the source cell portion, and the conducting capability of the current-sensor cell portion becomes lower than that of the source cell portion.

When the conducting capability of the current-sensor cell portion is lower and an overcurrent flows through the source cell portion, the current sensor may not be able to appropriately detect the overcurrent. To address this, making the output characteristics in the source cell portion per current density equivalent to those in the current-sensor cell portion as exemplified in FIG. 7 enables the current sensor to appropriately detect an overcurrent when the overcurrent flows through the source cell portion. A method of making the output characteristics in the source cell portion per current density equivalent to those in the current-sensor cell portion will be described later.

Embodiment 3

A MOSFET as an example semiconductor device according to Embodiment 3 will be described. Hereinafter, the same reference numerals will be assigned to the same structures described in Embodiments 1 and 2, and the detailed description thereof will be appropriately omitted.

Figure 8:
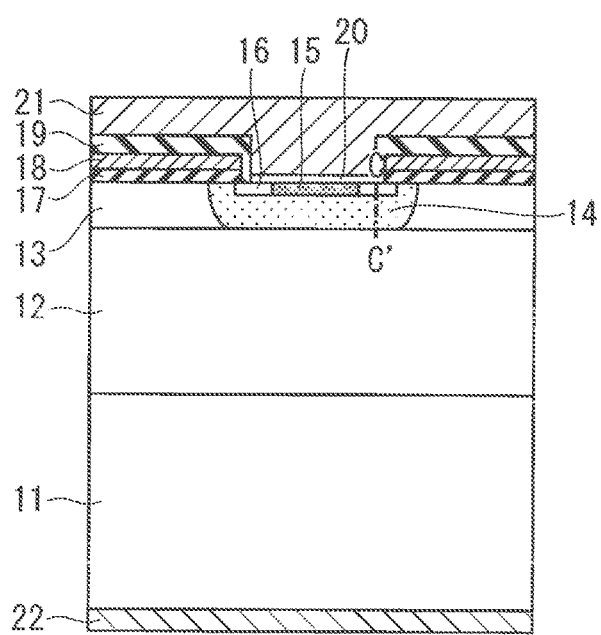
FIG. 8 is a cross-sectional view schematically illustrating the structure of the unit cell in the source cell portion with the SiC-MOSFET according to the embodiment.

FIG. 8 is a cross-sectional view schematically illustrating a structure of a unit cell in a source cell portion with a SiC-MOSFET according to Embodiment 2. FIG. 8 corresponds to the cross-section A-A' in FIG. 1.

Figure 9:
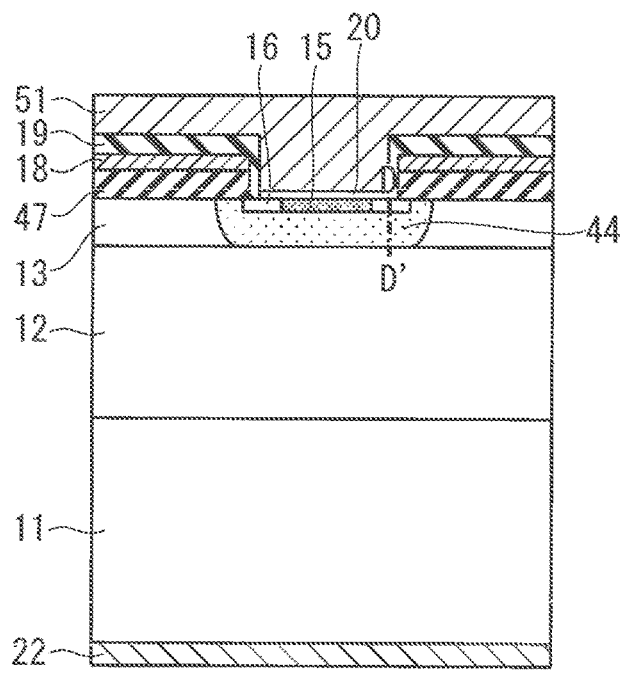
FIG. 9 is a cross-sectional view schematically illustrating the structure of the unit cell in the current-sensor cell portion with the SiC-MOSFET according to the embodiment.

FIG. 9 is a cross-sectional view schematically illustrating a structure of a unit cell in a current-sensor cell portion with the SiC-MOSFET according to Embodiment 2. The unit cell in the current-sensor cell portion includes a p-base layer 44. FIG. 9 corresponds to the cross-section B-B' in FIG. 1.

Figure 10:
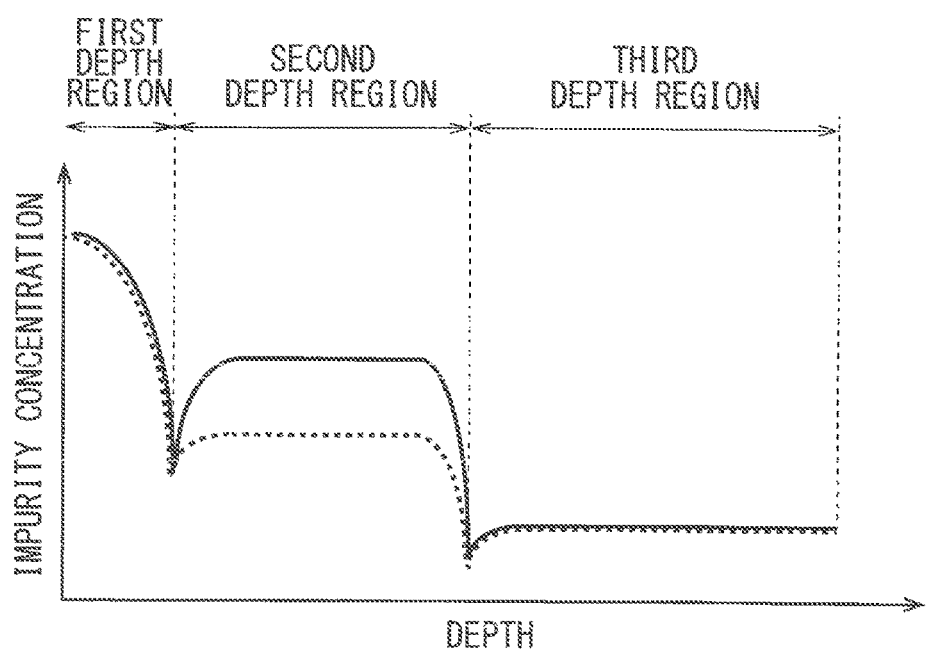
FIG. 10 is a diagram exemplifying respective concentration profiles of channel forming portions in the unit cells of the source cell portion and the current-sensor cell portion.

FIG. 10 is a diagram exemplifying respective concentration profiles of channel forming portions in the unit cells of the source cell portion and the current-sensor cell portion. Here, the channel forming portions are portions where channels are formed in the respective unit cells, specifically, surface layer portions of the p-base layers each sandwiched between the $n^+$ source layer 16 and the JFET $n^+$ layer 13.

In FIG. 10, the vertical axis represents the impurity concentration, and the horizontal axis represents the depth. The first, second, and third depth regions in FIG. 10 correspond to a depth region in which the $n^+$ source layer 16 is formed, a depth region in which the p-base layer is formed, and a depth region in which the $n^-$ layer 12 is formed, respectively. The concentration profile drawn by the solid line in FIG. 10 corresponds to a concentration profile of the channel forming portion in the unit cell of the source cell portion (a cross-section C-C' in FIG. 8), whereas the concentration profile drawn by the dotted line in FIG. 10 corresponds to a concentration profile of the channel forming portion in the unit cell of the current-sensor cell portion (a cross-section D-D' in FIG. 9).

As exemplified in FIG. 10, making the impurity concentration of the p-base layer 44 in the current-sensor cell portion lower than that of the p-base layer 14 in the source cell portion enables reduction in the channel resistance even when the gate oxide film 47 in the current-sensor cell portion is thicker than the gate oxide film 17 in the source cell portion. Thus, the output characteristics of the unit cell in the source cell portion per current density can be equivalent to those in the current-sensor cell.

According to the structure, the overcurrent can be appropriately detected by the current sensor while the electrostatic discharge ruggedness of the MOSFET is maintained with the gate oxide film 47 in the current-sensor cell portion being thicker than the gate oxide film 17 in the source cell portion.

Embodiment 4

A MOSFET as an example semiconductor device according to Embodiment 4 will be described. Hereinafter, the same reference numerals will be assigned to the same structures described in Embodiments 1 to 3, and the detailed description thereof will be appropriately omitted.

Figure 11:
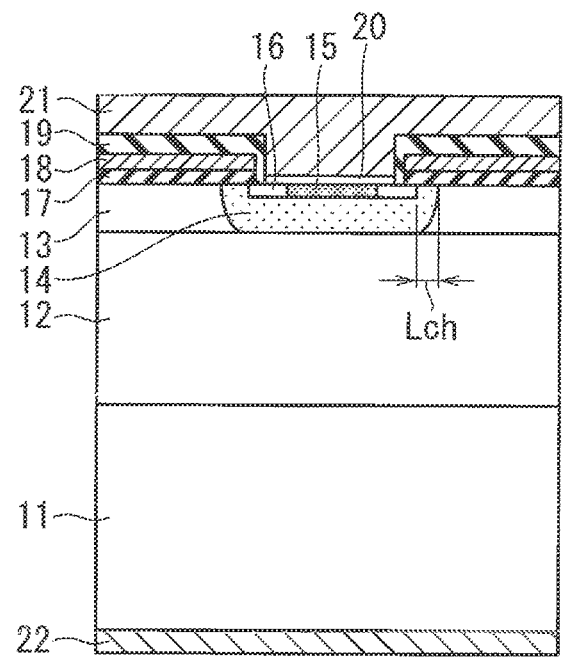
FIG. 11 is a cross-sectional view schematically illustrating the structure of the unit cell in the source cell portion with the SiC-MOSFET according to the embodiment.

FIG. 11 is a cross-sectional view schematically illustrating a structure of a unit cell in a source cell portion with a SiC-MOSFET according to Embodiment 4. FIG. 11 corresponds to the cross-section A-A' in FIG. 1.

Figure 12:
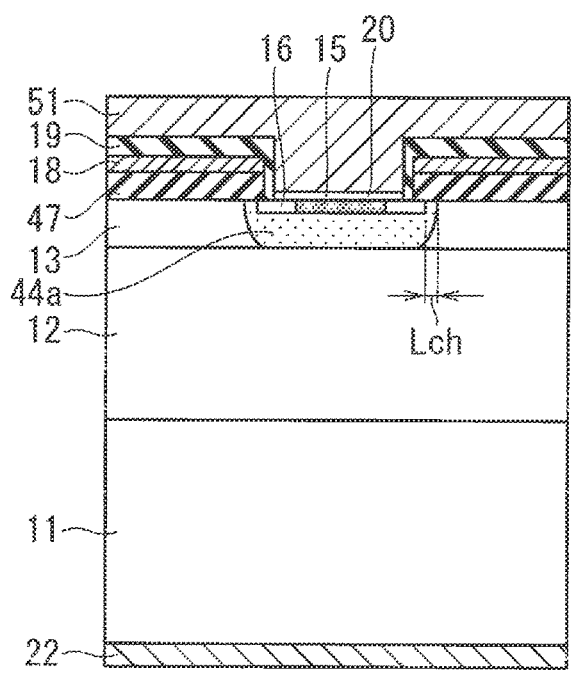
FIG. 12 is a cross-sectional view schematically illustrating the structure of the unit cell in the current-sensor cell portion with the SiC-MOSFET according to the embodiment.

FIG. 12 is a cross-sectional view schematically illustrating a structure of a unit cell in a current-sensor cell portion with the SiC-MOSFET according to Embodiment 4. The unit cell in the current-sensor cell portion includes a p-base layer 44a. FIG. 12 corresponds to the cross-section B-B' in FIG. 1.

As exemplified in FIGS. 11 and 12, shortening a channel length of the p-base layer 44a in the current-sensor cell portion (a length represented by Lch in FIG. 12) more than that of the p-base layer 14 in the source cell portion (a length represented by Lch in FIG. 11) enables reduction in the channel resistance.

Since the channel resistance can be reduced even when the gate oxide film 47 in the current-sensor cell portion is thicker than the gate oxide film 17 in the source cell portion, the output characteristics of the unit cell in the source cell portion per current density can be equivalent to those in the current-sensor cell portion.

Consequently, the overcurrent can be appropriately detected by the current sensor while the electrostatic discharge ruggedness of the MOSFET is maintained with the gate oxide film 47 in the current-sensor cell portion being thicker than the gate oxide film 17 in the source cell portion.

Embodiment 5

A MOSFET as an example semiconductor device according to Embodiment 5 will be described. Hereinafter, the same reference numerals will be assigned to the same structures described in Embodiments 1 to 4, and the detailed description thereof will be appropriately omitted.

Figure 13:
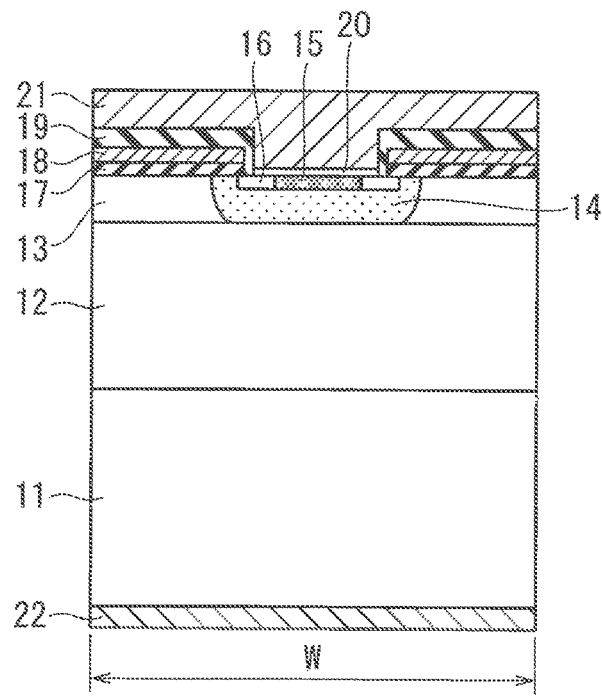
FIG. 13 is a cross-sectional view schematically illustrating the structure of the unit cell in the source cell portion with the SiC-MOSFET according to the embodiment.

FIG. 13 is a cross-sectional view schematically illustrating a structure of a unit cell in a source cell portion with a SiC-MOSFET according to Embodiment 5. FIG. 13 corresponds to the cross-section A-A' in FIG. 1.

Figure 14:
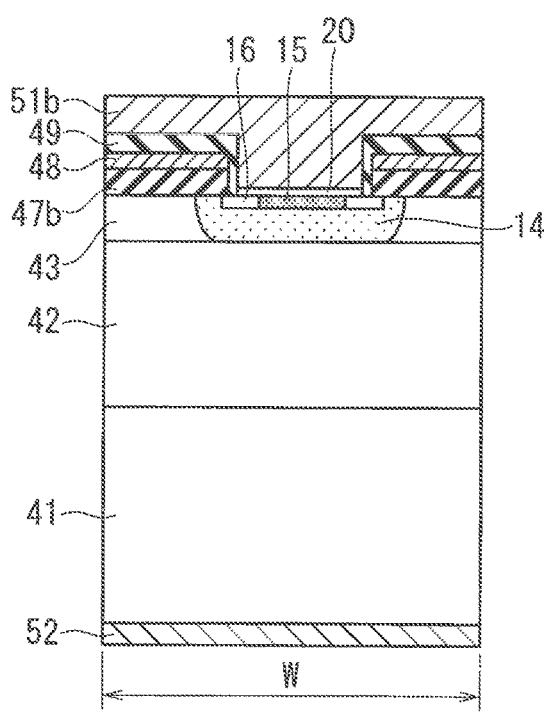
FIG. 14 is a cross-sectional view schematically illustrating the structure of the unit cell in the current-sensor cell portion with the SiC-MOSFET according to the embodiment.

FIG. 14 is a cross-sectional view schematically illustrating a structure of a unit cell in a current-sensor cell portion with the SiC-MOSFET according to Embodiment 5. The unit cell in the current-sensor cell portion includes an $n^+$ buffer layer 41 of n-type, an $n^-$ layer 42 of n-type, a JFET $n^+$ layer 43 of n-type, the p-base layer 14 of p-type, the $p^+$ layer 15 of p-type, the $n^+$ source layer 16 of n-type, a gate oxide film 47b, gate polysilicon 48, an interlayer insulation film 49, the Ni—Si layer 20, a current-sensor electrode 51b formed to cover the interlayer insulation film 49 and the Ni—Si layer 20, and a drain electrode 52. FIG. 14 corresponds to the cross-section B-B' in FIG. 1.

As exemplified in FIGS. 13 and 14, the size of the unit cell in the current-sensor cell portion (a width represented by "W" in FIG. 14) is smaller than the size of the unit cell in the source cell portion (a width represented by "W" in FIG. 13).

Since many more of the unit cells can be disposed even in the same areas for disposition, the ON resistance can be reduced even when the gate oxide film 47b in the current-sensor cell portion is thicker than the gate oxide film 17 in the source cell portion. Thus, the output characteristics of the unit cell in the source cell portion per current density can be equivalent to those in the current-sensor cell portion.

Consequently, the overcurrent can be appropriately detected by the current sensor while the electrostatic discharge ruggedness of the MOSFET is maintained with the gate oxide film 47b in the current-sensor cell portion being thicker than the gate oxide film 17 in the source cell portion.

Embodiment 6

A MOSFET as an example semiconductor device according to Embodiment 6 will be described. Hereinafter, the same reference numerals will be assigned to the same structures described in Embodiments 1 to 5, and the detailed description thereof will be appropriately omitted.

Figure 15:
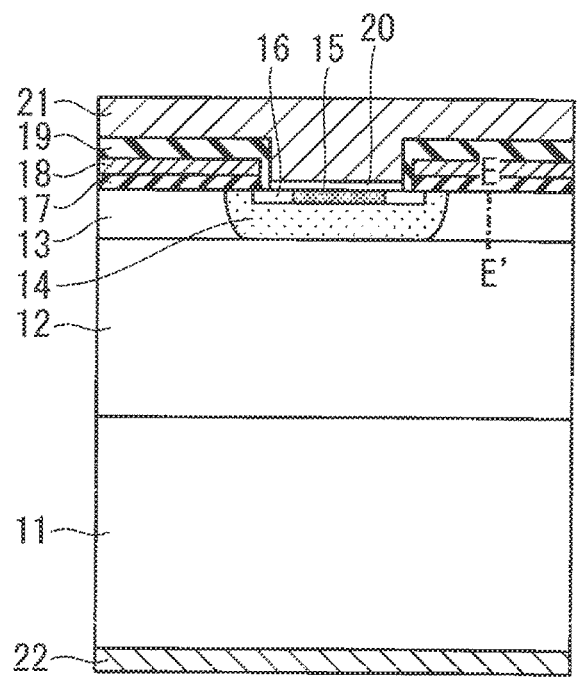
FIG. 15 is a cross-sectional view schematically illustrating the structure of the unit cell in the source cell portion with the SiC-MOSFET according to the embodiment.

FIG. 15 is a cross-sectional view schematically illustrating a structure of a unit cell in a source cell portion with a SiC-MOSFET according to Embodiment 6. FIG. 15 corresponds to the cross-section A-A' in FIG. 1.

Figure 16:
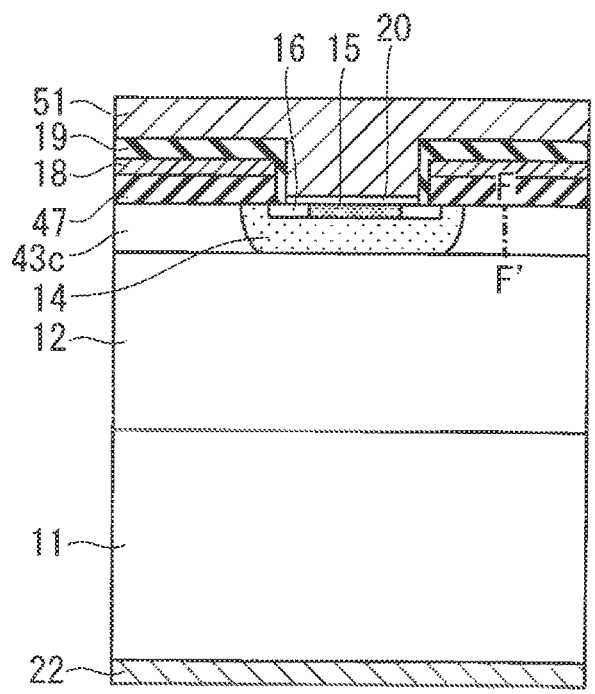
FIG. 16 is a cross-sectional view schematically illustrating the structure of the unit cell in the current-sensor cell portion with the SiC-MOSFET according to the embodiment.

FIG. 16 is a cross-sectional view schematically illustrating a structure of a unit cell in a current-sensor cell portion with the SiC-MOSFET according to Embodiment 6. The unit cell in the current-sensor cell portion includes a JFET n⁺ layer 43c. FIG. 16 corresponds to the cross-section B-B' in FIG. 1.

FIG. 17 is a diagram exemplifying respective concentration profiles of channel forming portions in the unit cells of the source cell portion and the current-sensor cell portion. Here, the channel forming portions are portions where channels are formed in the respective unit cells, specifically, surface layer portions of the p-base layers 14 each sandwiched between the n⁺ source layer 16 and the JFET n⁺ layer.

In FIG. 17, the vertical axis represents the impurity concentration, and the horizontal axis represents the depth. The fourth depth region in FIG. 17 corresponds to a depth region in which the JFET n⁺ layer is formed, and the fifth depth region in FIG. 17 corresponds to a depth region in which the n⁻ layer 12 is formed. The concentration profile drawn by the solid line in FIG. 17 corresponds to a concentration profile of the channel forming portion in the unit cell of the source cell portion (a cross-section E-E' in FIG. 15), whereas the concentration profile drawn by the dotted line in FIG. 17 corresponds to a concentration profile of the channel forming portion in the unit cell of the current-sensor cell portion (a cross-section F-F' in FIG. 16).

As exemplified in FIG. 17, making the impurity concentration of the JFET n⁺ layer 43c in the current-sensor cell portion higher than that of the JFET n⁺ layer 13 in the source cell portion enables reduction in the JFET resistance and the ON resistance even when the gate oxide film 47 in the current-sensor cell portion is thicker than the gate oxide film 17 in the source cell portion. Thus, the output characteristics of the unit cell in the source cell portion per current density can be equivalent to those in the current-sensor cell portion.

According to the structure, the overcurrent can be appropriately detected by the current sensor while the electrostatic discharge ruggedness of the MOSFET is maintained with the gate oxide film 47 in the current-sensor cell portion being thicker than the gate oxide film 17 in the source cell portion.

Embodiment 7

A MOSFET as an example semiconductor device according to Embodiment 7 will be described. Hereinafter, the same reference numerals will be assigned to the same structures described in Embodiments 1 to 6, and the detailed description thereof will be appropriately omitted.

FIG. 18 is a diagram exemplifying transfer characteristics of the source cell portion with the SiC-MOSFET exemplified in FIG. 4 per current density (a solid line) and transfer characteristics of the current-sensor cell portion with the SiC-MOSFET exemplified in FIG. 5 per current density (a dotted line). In FIG. 18, the vertical axis represents the current density ($J_{DS}$), and the horizontal axis represents the voltage ($V_{GS}$).

Figure 19:
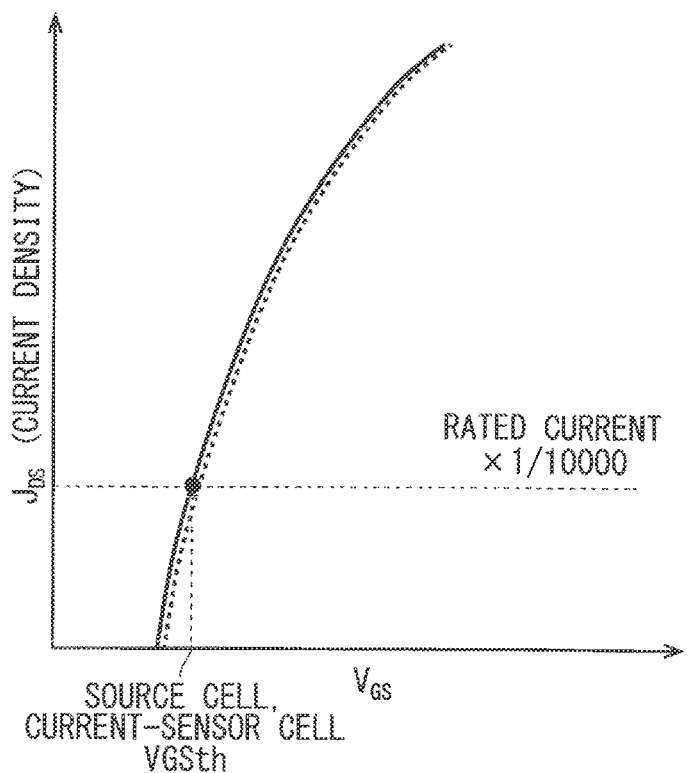
FIG. 19 is a diagram exemplifying transfer characteristic waveforms of the SiC-MOSFETs exemplified in FIGS. 4 and 5 when the transfer characteristics of the source cell portion and the current-sensor cell portion per current density are combined.

FIG. 19 is a diagram exemplifying the transfer characteristic waveforms of the SiC-MOSFETs exemplified in FIGS. 4 and 5 when the transfer characteristics of the source cell portion and the current-sensor cell portion per current density are combined. In FIG. 19, the vertical axis represents the current density ($J_{DS}$), and the horizontal axis represents the voltage ($V_{GS}$).

Since the gate oxide film 47 in the current-sensor cell portion is formed thicker than the gate oxide film 17 in the source cell portion in the structure, a voltage between gate and source necessary for forming a channel in the current-sensor cell portion is higher than that in the source cell portion.

Thus, the ON resistance in the current-sensor cell portion becomes higher than that in the source cell portion, and the conducting capability of the current-sensor cell portion becomes lower than that of the source cell portion.

Thus, the current-sensor cell portion has the transfer characteristics allowing a current to hardly flow therethrough than those of the source cell portion.

When the transfer characteristics of the current-sensor cell portion are lower and an overcurrent flows through the source cell portion in transient times such as when turned ON, the current sensor may not be able to appropriately detect the overcurrent. To address this, making the transfer characteristics in the source cell portion per current density equivalent to those in the current-sensor cell portion as exemplified in FIG. 19 enables the current sensor to appropriately detect an overcurrent when the overcurrent flows through the source cell portion. A method of making the transfer characteristics in the source cell portion per current density equivalent to those in the current-sensor cell portion will be described later.

Embodiment 8

A MOSFET as an example semiconductor device according to Embodiment 8 will be described. Hereinafter, the same reference numerals will be assigned to the same structures described in Embodiments 1 to 7, and the detailed description thereof will be appropriately omitted.

Figure 20:
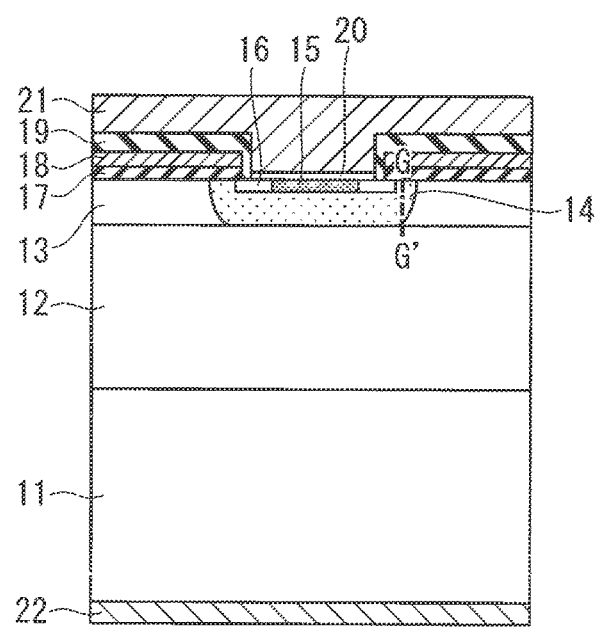
FIG. 20 is a cross-sectional view schematically illustrating the structure of the unit cell in the source cell portion with the SiC-MOSFET according to the embodiment.

FIG. 20 is a cross-sectional view schematically illustrating a structure of a unit cell in a source cell portion with a SiC-MOSFET according to Embodiment 8. FIG. 20 corresponds to the cross-section A-A' in FIG. 1.

FIG. 21 is a cross-sectional view schematically illustrating a structure of a unit cell in a current-sensor cell portion with the SiC-MOSFET according to Embodiment 8. The unit cell in the current-sensor cell portion includes a p-base layer 44d. FIG. 21 corresponds to the cross-section B-B' in FIG. 1.

FIG. 22 is a diagram exemplifying respective concentration profiles of channel forming portions in the unit cells of the source cell portion and the current-sensor cell portion. Here, the channel forming portions are portions where channels are formed in the respective unit cells, specifically, surface layer portions of the p-base layers each sandwiched between the n⁺ source layer 16 and the JFET n⁺ layer 13.

In FIG. 22, the vertical axis represents the impurity concentration, and the horizontal axis represents the depth. The sixth depth region in FIG. 22 corresponds to a depth region in which the p-base layer is formed, and the seventh depth region in FIG. 22 corresponds to a depth region in which the n⁻ layer 12 is formed. The concentration profile drawn by the solid line in FIG. 22 corresponds to a concentration profile of the channel forming portion in the unit cell of the source cell portion (a cross-section G-G' in FIG. 20), whereas the concentration profile drawn by the dotted line in FIG. 22 corresponds to a concentration profile of the channel forming portion in the unit cell of the current-sensor cell portion (a cross-section H-H' in FIG. 21).

As exemplified in FIG. 22, implantation of n-type impurities reduces the impurity concentration of the p-base layer 44d in the current-sensor cell portion more than that of the p-base layer 14 in the source cell portion. This process can reduce the channel resistance even when the gate oxide film 47 in the current-sensor cell portion is thicker than the gate oxide film 17 in the source cell portion. Thus, the transfer characteristics of the unit cell in the source cell portion per current density can be equivalent to those in the current-sensor cell portion. In other words, a threshold voltage (VGSth) between gate and source of the unit cell in the source cell portion can be equivalent to a threshold voltage (VGSth) between gate and source of the unit cell in the current-sensor cell portion.

According to the structure, the overcurrent can be appropriately detected by the current sensor while the electrostatic discharge ruggedness of the MOSFET is maintained with the gate oxide film 47 in the current-sensor cell portion being thicker than the gate oxide film 17 in the source cell portion.

The structures of Embodiments above even with application of not only the SiC-MOSFET but also a wide-bandgap semiconductor material such as GaN can produce the same advantages.

Here, the wide-bandgap semiconductor typically refers to a semiconductor having a band gap approximately higher than or equal to 2 eV. Examples of known wide-bandgap semiconductors include group III-nitrides such as gallium nitride (GaN), group II-nitrides such as zinc oxide (ZnO), group II-chalcogenide such as zinc selenide (ZnSe), diamond, and silicon carbide.

Advantages

The following will exemplify the advantages produced by Embodiments described above.

A MOSFET as an example semiconductor device according to Embodiments above includes: a first switching element through which a main current flows; and a second switching element through which a sense current flows.

The MOSFET in a source cell portion functioning as the first switching element includes: the $n^-$ layer 12 functioning as the drift layer of the first conductivity type; the p-base layer 14 functioning as the first base layer of the second conductivity type; the $n^+$ source layer 16 functioning as the first source layer of the first conductivity type; the gate oxide film 17 functioning as the first gate oxide film; and the gate polysilicon 18 functioning as the first gate electrode.

The p-base layer 14 is formed in a surface layer of the $n^-$ layer 12. The $n^+$ source layer 16 is formed in a surface layer of the p-base layer 14.

The gate oxide film 17 is formed in contact with the p-base layer 14 sandwiched between the $n^+$ source layer 16 and the n layer 12. The gate polysilicon 18 is formed in contact with the gate oxide film 17.

The MOSFET in a current-sensor cell portion functioning as the second switching element includes: the $n^-$ layer 12; the p-base layer 14 functioning as the second base layer of the second conductivity type; the $n^+$ source layer 16 functioning as the second source layer of the first conductivity type; the gate oxide film 47 functioning as the second gate oxide film; and the gate polysilicon 18 functioning as the second gate electrode.

The p-base layer 14 corresponding to the second switching element is formed in the surface layer of the $n^-$ layer 12 corresponding to the second switching element, to be spaced apart from the p-base layer 14 corresponding to the first switching element. The n+ source layer 16 corresponding to the second switching element is formed in a surface layer of the p-base layer 14 corresponding to the second switching element.

The gate oxide film 47 is formed in contact with the p-base layer 14 corresponding to the second switching element that is sandwiched between the n+ source layer 16 corresponding to the second switching element and the $n^-$ layer 12 corresponding to the second switching element.

The gate polysilicon 18 corresponding to the second switching element is formed in contact with the gate oxide film 47.

A part of the gate oxide film 47 including a portion covering the p-base layer 14 corresponding to the second switching element is thicker than the gate oxide film 17.

The MOSFET in the current-sensor cell portion functioning as the second switching element includes: the $n^-$ layer 12; the p-base layer 44 functioning as the second base layer of the second conductivity type; the $n^+$ source layer 16 functioning as the second source layer of the first conductivity type; the gate oxide film 47 functioning as the second gate oxide film; and the gate polysilicon 18 functioning as the second gate electrode.

The p-base layer 44 corresponding to the second switching element is formed in the surface layer of the $n^-$ layer 12 corresponding to the second switching element, to be spaced apart from the p-base layer 14 corresponding to the first switching element. The $n^+$ source layer 16 corresponding to the second switching element is formed in a surface layer of the p-base layer 44 corresponding to the second switching element.

The gate oxide film 47 is formed in contact with the p-base layer 44 corresponding to the second switching element that is sandwiched between the $n^+$ source layer 16 corresponding to the second switching element and the $n^-$ layer 12 corresponding to the second switching element.

The gate polysilicon 18 corresponding to the second switching element is formed in contact with the gate oxide film 47.

A part of the gate oxide film 47 including a portion covering the p-base layer 44 corresponding to the second switching element is thicker than the gate oxide film 17.

The MOSFET in the current-sensor cell portion functioning as the second switching element includes: the $n^-$ layer 12; the p-base layer 44a functioning as the second base layer of the second conductivity type; the $n^+$ source layer 16 functioning as the second source layer of the first conductivity type; the gate oxide film 47 functioning as the second gate oxide film; and the gate polysilicon 18 functioning as the second gate electrode.

The p-base layer 44a corresponding to the second switching element is formed in the surface layer of the $n^-$ layer 12 corresponding to the second switching element, to be spaced apart from the p-base layer 14 corresponding to the first switching element. The $n^+$ source layer 16 corresponding to the second switching element is formed in a surface layer of the p-base layer 44a corresponding to the second switching element.

The gate oxide film 47 is formed in contact with the p-base layer 44a corresponding to the second switching element that is sandwiched between the $n^+$ source layer 16 corresponding to the second switching element and the $n^-$ layer 12 corresponding to the second switching element.

The gate polysilicon 18 corresponding to the second switching element is formed in contact with the gate oxide film 47.

A part of the gate oxide film 47 including a portion covering the p-base layer 44a corresponding to the second switching element is thicker than the gate oxide film 17.

The MOSFET in the current-sensor cell portion functioning as the second switching element includes: the $n^-$ layer 42; the p-base layer 14 functioning as the second base layer of the second conductivity type; the $n^+$ source layer 16 functioning as the second source layer of the first conductivity type; the gate oxide film 47b functioning as the second gate oxide film; and the gate polysilicon 18 functioning as the second gate electrode.

The p-base layer 14 corresponding to the second switching element is formed in the surface layer of the n⁻ layer 42 corresponding to the second switching element, to be spaced apart from the p-base layer 14 corresponding to the first switching element. The n⁺ source layer 16 corresponding to the second switching element is formed in a surface layer of the p-base layer 14 corresponding to the second switching element.

The gate oxide film 47b is formed in contact with the p-base layer 14 corresponding to the second switching element that is sandwiched between the n⁺ source layer 16 corresponding to the second switching element and the n⁻ layer 42 corresponding to the second switching element.

The gate polysilicon 48 corresponding to the second switching element is formed in contact with the gate oxide film 47b.

A part of the gate oxide film 47b including a portion covering the p-base layer 14 corresponding to the second switching element is thicker than the gate oxide film 17.

The MOSFET in the current-sensor cell portion functioning as the second switching element includes: the n⁻ layer 12; the p-base layer 44d functioning as the second base layer of the second conductivity type; the n⁺ source layer 16 functioning as the second source layer of the first conductivity type; the gate oxide film 47 functioning as the second gate oxide film; and the gate polysilicon 18 functioning as the second gate electrode.

The p-base layer 44d corresponding to the second switching element is formed in the surface layer of the n⁻ layer 12 corresponding to the second switching element, to be spaced apart from the p-base layer 14 corresponding to the first switching element. The n⁺ source layer 16 corresponding to the second switching element is formed in a surface layer of the p-base layer 44d corresponding to the second switching element.

The gate oxide film 47 is formed in contact with the p-base layer 44d corresponding to the second switching element that is sandwiched between the n⁺ source layer 16 corresponding to the second switching element and the n⁻ layer 12 corresponding to the second switching element.

The gate polysilicon 18 corresponding to the second switching element is formed in contact with the gate oxide film 47.

A part of the gate oxide film 47 including a portion covering the p-base layer 44d corresponding to the second switching element is thicker than the gate oxide film 17.

With the structure in which a part of the gate oxide film including a portion covering the p-base layer in the current-sensor cell portion through which the sense current flows is thicker than the gate oxide film 17 in the source cell portion through which the main current flows, the electrostatic discharge ruggedness of the MOSFET including the current sensor can be improved.

Although structures other than these structures can be appropriately omitted, the advantages described above can be produced even with addition of at least one of the other structures in the Description.

According to Embodiments, output characteristics of the first switching element per current density are equal to output characteristics of the second switching element per current density. The cases where they are "equal" include cases with tolerances of approximately ±5% with respect to measured values.

With the structure thickening the gate oxide film in the unit cell of the current-sensor cell portion, the performance for detecting an overcurrent in the current-sensor cell portion can be maintained while the electrostatic discharge ruggedness of the current-sensor cell portion is improved.

According to Embodiments, the p-base layer 44 functioning as the second base layer is lower in impurity concentration than the p-base layer 14.

With the structure thickening the gate oxide film in the unit cell of the current-sensor cell portion, the performance for detecting an overcurrent in the current-sensor cell portion can be maintained through reduction in the impurity concentration of the p-base layer 44 of the current-sensor cell portion while the electrostatic discharge ruggedness of the current-sensor cell portion is improved.

According to Embodiments, the second switching element is shorter in channel length than the first switching element.

With the structure thickening the gate oxide film in the unit cell of the current-sensor cell portion, the performance for detecting an overcurrent in the current-sensor cell portion can be maintained by shortening the channel length of the current-sensor cell portion while the electrostatic discharge ruggedness of the current-sensor cell portion is improved.

According to Embodiments, the second switching element is smaller in cell size than the first switching element.

With the structure thickening the gate oxide film in the unit cell of the current-sensor cell portion, the performance for detecting an overcurrent in the current-sensor cell portion can be maintained through reduction in the cell size of the current-sensor cell portion while the electrostatic discharge ruggedness of the current-sensor cell portion is improved.

According to Embodiments, the JFET n⁺ layer 43c that is the surface layer of the n⁻ layer 12 corresponding to the second switching element is higher in impurity concentration than the JFET n⁺ layer 13 that is the surface layer of the n⁻ layer 12 corresponding to the first switching element.

With the structure thickening the gate oxide film in the unit cell of the current-sensor cell portion, the performance for detecting an overcurrent in the current-sensor cell portion can be maintained by increasing the impurity concentration of a JFET region in the current-sensor cell portion while the electrostatic discharge ruggedness of the current-sensor cell portion is improved.

According to Embodiments, the first and second switching elements are equal in gate threshold voltage. The cases where they are "equal" include cases with tolerances of approximately ±5% with respect to measured values.

With the structure thickening the gate oxide film in the unit cell of the current-sensor cell portion, the performance for detecting an overcurrent in the current-sensor cell portion can be maintained by making the gate threshold voltage of the current-sensor cell portion equal to that of the source cell portion while the electrostatic discharge ruggedness of the current-sensor cell portion is improved.

According to Embodiments, the p-base layer 44d functioning as the second base layer is lower in impurity concentration than the p-base layer 14.

With the structure thickening the gate oxide film in the unit cell of the current-sensor cell portion, the performance for detecting an overcurrent in the current-sensor cell portion can be maintained through reduction in the impurity concentration of the p-base layer 44d of the current-sensor cell portion while the electrostatic discharge ruggedness of the current-sensor cell portion is improved.

According to Embodiments, the n⁻ layer 12 includes a wide-bandgap semiconductor material.

With such a structure, even a MOSFET using a wide-bandgap semiconductor material other than SiC such as GaN can improve the electrostatic discharge ruggedness of the current-sensor cell portion while maintaining the conducting capability of the current-sensor cell portion.

According to Embodiments, the n⁻ layer 12 includes silicon carbide.

With such a structure, a MOSFET using SiC can improve the electrostatic discharge ruggedness of the current-sensor cell portion while maintaining the conducting capability of the current-sensor cell portion.

Modifications

Although Embodiments described above may specify properties, materials, dimensions, shapes, relative arrangement relationships, and conditions for implementation of each of the constituent elements, these are in all aspects illustrative and are not limited to those in the Description. Thus, numerous modifications that have yet been exemplified will be devised within the scope of the invention. Examples of the modifications include modifying, adding, or omitting at least one of the constituent elements, and further extracting at least one of the constituent elements in at least one of Embodiments and combining the extracted constituent element with a constituent element in the other Embodiments.

The constituent element described as one element in Embodiments above may be more than one unless it is contradictory. The respective constituent elements are conceptual units, and include one constituent element comprising a plurality of structures, one constituent element corresponding to a part of a structure, and a plurality of constituent elements included in one structure. Furthermore, each of the constituent elements includes a structure having another structure or shape as long as it performs the same function.

The explanation in the Description is referred to for all the objectives of the present technique, and is not regarded as prior art.

When Embodiments specify, for example, the name of a material without any particular designation, the material includes another additive, for example, an alloy unless it is contradictory.

Although Embodiments describe the MOSFETs as example semiconductor devices, insulated gate bipolar transistors (IGBTs) can be also assumed as the example semiconductor devices.

EXPLANATION OF REFERENCE SIGNS 1 source pad, 4 current sensor pad, 5 gate pad, 7 gate line, 11, 41 n⁺ buffer layer, 12, 42 n⁻ layer, 13, 43, 43c JFET n⁺ layer, 14, 44, 44a, 44d p-base layer, 15 p⁺ layer, 16 n⁺ source layer, 17, 47, 47b gate oxide film, 18, 48 gate polysilicon, 19, 49 interlayer insulation film, 20 Ni—Si layer, 21 source electrode, 22, 52 drain electrode, 51, 51b current-sensor electrode.

The invention claimed is:

1. A semiconductor device, comprising:
   a first switching element through which a main current flows; and
   a second switching element through which a sense current flows,
   said first switching element including:
      a drift layer of a first conductivity type;
      a first base layer of a second conductivity type, said first base layer being formed in a surface layer of said drift layer;
      a first source layer of said first conductivity type, said first source layer being formed in a surface layer of said first base layer;
      a first gate oxide film formed in contact with said first base layer sandwiched between said first source layer and said drift layer; and
      a first gate electrode formed in contact with said first gate oxide film, and
   said second switching element including:
      said drift layer;
      a second base layer of said second conductivity type, said second base layer formed in said surface layer of said drift layer to be spaced apart from said first base layer;
      a second source layer of said first conductivity type, said second source layer being formed in a surface layer of said second base layer;
      a second gate oxide film formed in contact with said second base layer sandwiched between said second source layer and said drift layer; and
      a second gate electrode formed in contact with said second gate oxide film,
   wherein a part of said second gate oxide film including a portion covering said second base layer is thicker than said first gate oxide film, and
   said first and second switching elements are equal in gate threshold voltage.

2. The semiconductor device according to claim 1, wherein output characteristics of said first switching element per current density are equal to output characteristics of said second switching element per current density.

3. The semiconductor device according to claim 2, wherein said second base layer is lower in impurity concentration than said first base layer.

4. The semiconductor device according to claim 2, wherein said second switching element is shorter in channel length than said first switching element.

5. The semiconductor device according to claim 2, wherein said second switching element is smaller in cell size than said first switching element.

6. The semiconductor device according to claim 2, wherein said surface layer of said drift layer that corresponds to said second switching element is higher in impurity concentration than said surface layer of said drift layer that corresponds to said first switching element.

7. The semiconductor device according to claim 1, wherein said second base layer is lower in impurity concentration than said first base layer.

8. The semiconductor device according to claim 1, wherein said drift layer includes a wide-bandgap semiconductor material.

9. The semiconductor device according to claim 8, wherein said drift layer includes silicon carbide.

10. The semiconductor device according to claim 1, wherein said first and second switching elements are MOSFETs.

* * * * *